(12) United States Patent
Wang et al.

(10) Patent No.: US 8,131,122 B2
(45) Date of Patent: Mar. 6, 2012

(54) MONOLITHICALLY INTEGRATED MULTI-DIRECTIONAL TRANSCEIVER

(75) Inventors: Lei Wang, Hangzhou (CN); Li Zhang, Hangzhou (CN); Jian-Jun He, Hangzhou (CN)

(73) Assignee: Zhejiang University, Hangzhou (CN)

( * ) Notice: Subject to any disclaimer, the term of this patent is extended or adjusted under 35 U.S.C. 154(b) by 454 days.

(21) Appl. No.: 12/509,453

(22) Filed: Jul. 25, 2009

(65) Prior Publication Data

US 2010/0021171 A1 Jan. 28, 2010

Related U.S. Application Data

(60) Provisional application No. 61/083,920, filed on Jul. 26, 2008.

(51) Int. Cl.
*G02B 6/12* (2006.01)
*H04B 10/24* (2006.01)

(52) U.S. Cl. .......................................... 385/14; 398/139

(58) Field of Classification Search .................. 398/139
See application file for complete search history.

(56) References Cited

U.S. PATENT DOCUMENTS 4,558,920 A * 12/1985 Newton et al. .................. 385/30
* cited by examiner

*Primary Examiner* — Jerry Rahll

(57) ABSTRACT

An integrated single-fiber multi-directional transceiver such as a diplexer or triplexer for FTTH applications comprises at least a laser for transmitting a first signal at a first wavelength, a photodetector for receiving a second signal at a second wavelength, and a 2×2 optical coupler. The 2×2 optical coupler has four ports, of which port 1 connects to a fiber through an input/output waveguide, port 2 leads to the photodetector through another waveguide, port 3 and port 4 are connected with the gain waveguide and are placed inside the laser cavity. Light emitted by the gain waveguide inside the laser cavity at port 3 of the coupler is partially coupled to port 4 as a feedback for the laser and partially coupled to port 1 which couples to the optical fiber to transmit the first signal. On the other hand, the second signal at the second wavelength that is launched into the coupler from the input/output waveguide at port 1 is entirely coupled to port 2 that leads to the photodetector. The design allows both the transmitted and received signals to be directed to their intended destinations with minimal loss.

10 Claims, 5 Drawing Sheets

MONOLITHICALLY INTEGRATED MULTI-DIRECTIONAL TRANSCEIVER

RELATED APPLICATIONS

This application claims benefit from U.S. Provisional Patent Application No. 61/083,920, filed on Jul. 26, 2008, entitled "Monolithically integrated multi-directional transceiver".

FIELD OF THE INVENTION

This invention relates generally to single-fiber multi-directional transceivers and more particularly to monolithically integrated diplexers and triplexers for FTTH applications.

BACKGROUND OF THE INVENTION

Low-cost single-fiber multi-directional transceivers such as diplexers and triplexers used in Optical Network Unit (ONU) are of significant importance to the development of Fiber-To-The-Home (FTTH) networks. Traditional diplexers and triplexers are based on thin-film-filter (TFF) technology that uses lenses, filters, and other micro-optic components assembled by hand. Although the manufacturing cost has been reduced significantly in recent years, further cost reduction is difficult due to the labor-intensive packaging. A monolithic integrated solution that reduces the number of subcomponents and alignment emerges as a promising alternative. It is especially suited to mass production which can meet the demand of the potentially explosive growth of the FTTH market. However, monolithic integration needs expensive InP-compatible materials to build all components of different functionalities. Diplexers/triplexers with large dimensions and complex fabrication will greatly increase the cost, and counteract the advantages brought by the monolithic integration.

At an ONU, triplexers are used to separate two downstream signals transmitted in a fiber at two different wavelengths and direct them to a digital signal receiver and an analog signal receiver while coupling an upstream optical signal emitted by a digital transmitter to the same fiber. They are essential components for FTTH systems. Usually the downstream digital signal received by the ONU is at 1490 nm, analog signal at 1550 nm, and the upstream digital signal at 1310 nm. In some systems, the 1550 nm analog channel is not used. Diplexers are then used to receive and transmit digital signals at 1490 nm and 1310 nm, respectively.

An InP-based single-fiber bidirectional transceiver was reported in an article entitled "Monolithically Integrated Diplexer Chip for PON Applications", by A. Behfar et al., in proceedings of the Optical Fiber Communication Conference, vol. 2, pp. 3, 2005, as showed in FIG. 2. An InGaAlAs based multiple quantum well laser structure is grown on top of an InGaAs p-i-n structure by metal organic chemical vapor deposition on an InP substrate. A Fabry-Perot Horizontal Cavity Surface Emitting Laser which contains a 45 degree etched mirror is used as the upstream signal transmitter. The 1310 nm light generated in the laser cavity is reflected out of the plane of the chip by the 45 degree etched mirror and focused by a lens to an optical fiber while 1490 nm downstream beam launched from the fiber is broaden by the lens, projected onto the chip and finally absorbed by the PIN detector. Although the chip provides a low cost integrated solution of diplexers, it has a significant drawback due to the fact that a lens is required for coupling the upstream/downstream signals from and into the fiber. The use of bulk optical components (e.g. lens) complicates the package processes. Beside, it is difficult to extend it for use as a triplexer due to its vertically coupled multiplexing mechanism.

A simple diplexer can be realized using an extra-cavity 1×2 or 2×2 coupler that couples the upstream and downstream signals to an optical fiber as shown in FIG. 3. The downstream signal launched into port 1 is coupled to port 2 and then absorbed by the following photodetector, while the upstream signal emitted by the laser 6 is coupled to port 1. It can be realized by hybrid integration or monolithic integration. However, a disadvantage of this simple diplexer is that a part of the downstream signal is coupled to port 3, which will not only introduce downstream loss but also disturb the transmitted laser signal from port 3. Similarly, a portion of the upstream signal is unintentionally coupled to port 4, causing an upstream loss. There is a compromise between the upstream and downstream losses in this design, i.e. if the downstream loss is low, the upstream loss is high. Usually a 3 dB coupler is used which produces a 50% loss for each signal.

A more complex approach for realizing diplexer/triplexer is to use a wavelength multiplexer such as an Arrayed Waveguide Gratings (AWG), an Echelle Diffraction Gratings (EDG), or a Mach-Zehnder Interferometers (MZI) to accomplish highly wavelength selective coupling. Such an element, however, has disadvantages of large foot prints, complex fabrication processes, and high cost.

SUMMARY OF THE INVENTION

It is an object of the invention to provide a monolithically integrated single-fiber multi-directional transceiver for FTTH applications which can overcome the drawbacks of prior arts. The device comprises a laser, a photodetector and a 2×2 optical coupler. The optical coupler does not need to be highly wavelength selective, but only wavelength-dependent to a certain extent similar to a conventional directional coupler. There are 4 ports in the coupler. The downstream signal is coupled from port 1 to port 2 through a waveguide connecting the two ports. The waveguide connecting port 3 and port 4 is placed inside the laser cavity. The coupler is designed such that the downstream signals pass through the coupler from port 1 to port 2 with very little loss. On the other hand, the light launched from port 3 is partially directed to port 1 for upstream signal transmission and partially coupled to port 4 for laser feedback. In theory, no optical power is uselessly lost. Therefore, the operation mechanism of the invention overcomes the drawbacks of the prior-art techniques concerning optical loss and crosstalk while maintaining other merits of monolithic integration including compactness, highly integrated functionalities, ease for high volume production and low cost. It is also possible for the single-fiber bi-directional transceiver (diplexer) to be further extended to a single-fiber tri-directional transceiver (triplexer).

In accordance with the invention, there is provided, an integrated single-fiber multi-directional transceiver comprising a laser (10) for transmitting a first optical signal at a first wavelength, a photodetector (30) for receiving a second optical signal at a second wavelength, and a 2×2 4-port optical coupler (20), said optical coupler (20) being structured such that it receives the second optical signal from an optical fiber (50) at port 1 and directs it to port 2 which leads to the photodetector (30) where the second optical signal is absorbed, whereas an optical waveguide connecting port 3 and port 4 within the optical coupler (20) is placed inside the cavity of the laser (10) so that a portion of the light generated inside the cavity and launched from port 3 is coupled to port 4 and therefore remains in the cavity as an optical feedback while the other portion of the light is coupled to port 1 and is transmitted to the same optical fiber (50).

DETAILED DESCRIPTION

Without losing the generality, the single-fiber multi-directional transceiver of the present invention will be described in reference to ITU standard of ONU with 1310 nm for upstream transmission and 1490/1550 nm for downstream reception. To avoid the performance degradation caused by the center wavelength drift of the lasers, the bandwidths of the downstream signal at 1490 nm and 1550 nm and the upstream signal at 1310 nm are 20 nm, 10 nm and 100 nm, respectively, according to the ITU standard.

Figure 1:
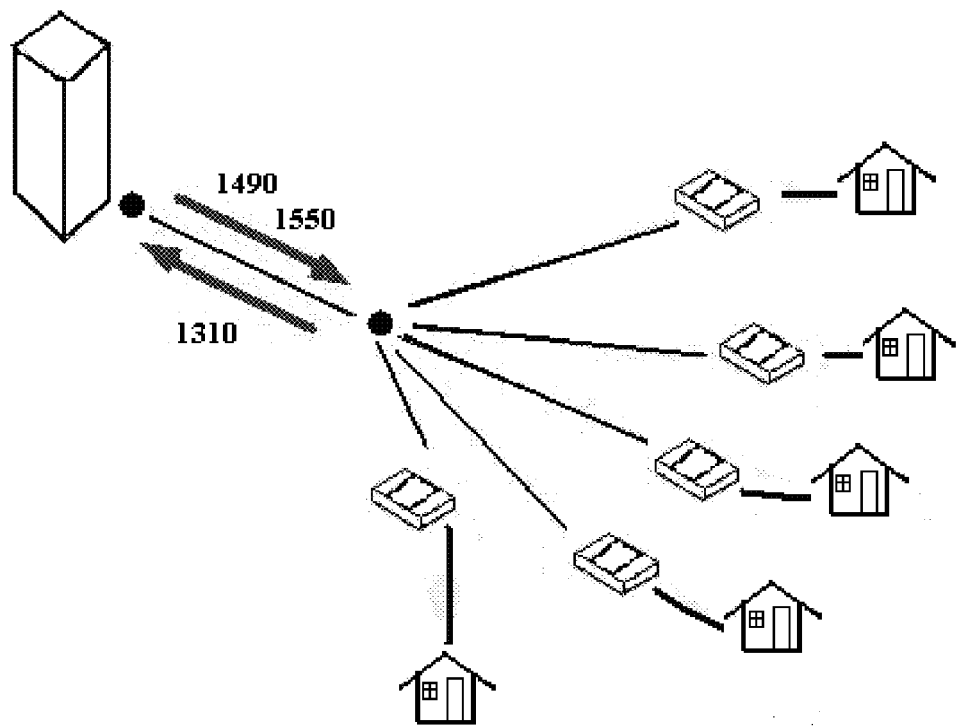
FIG. 1 is a schematic diagram of a typical PON network illustrating the background application of the invention.
Figure 2:
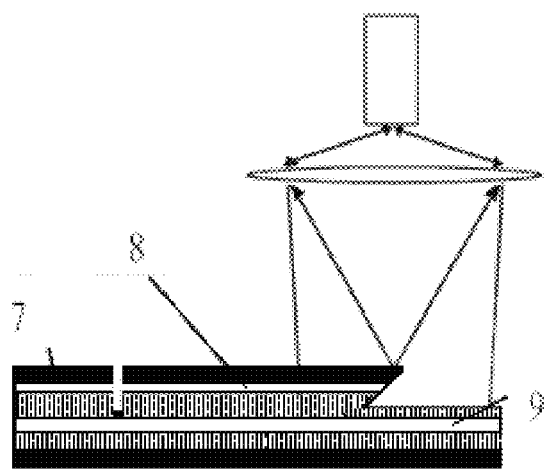
FIG. 2 is a schematic diagram of a prior-art monolithically integrated bi-directional transceiver.
Figure 3:
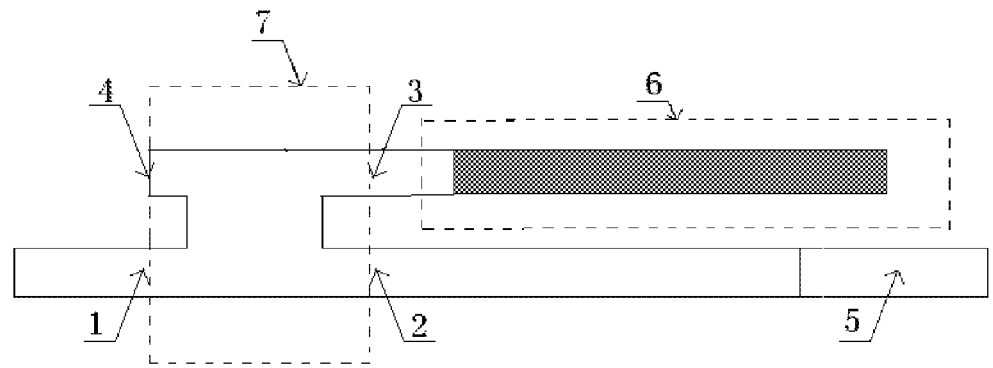
FIG. 3 is a schematic diagram of a prior-art design for a single-fiber bi-directional transceiver.
Figure 4:
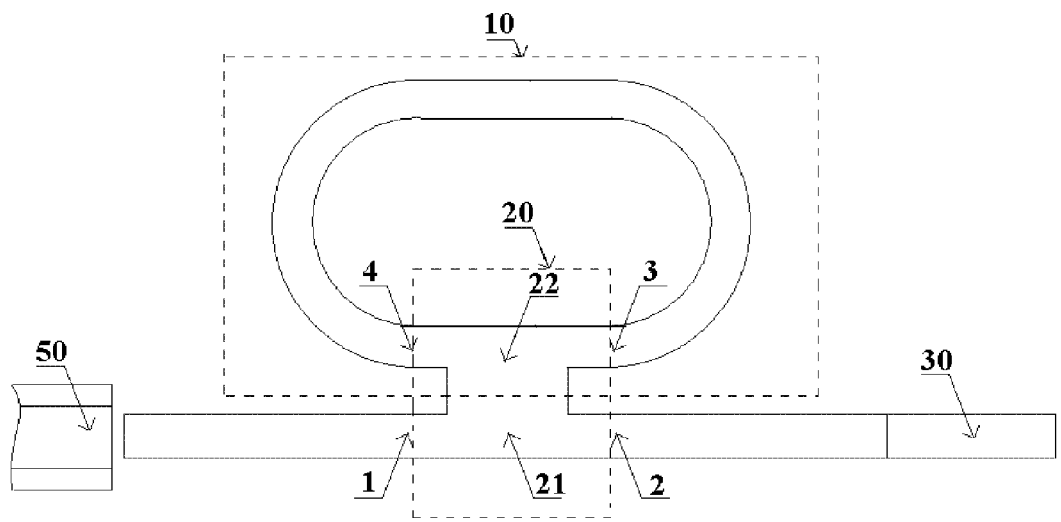
FIG. 4 is a schematic diagram of the first embodiment of the present invention in which a ring resonator is used for the laser cavity.

FIG. 4 depicts one embodiment of the present invention as a single-fiber bi-directional transceiver (diplexer). It consists of a ring laser 10, a 2×2 coupler 20 and a photodetector 30. The downstream signals in 1490 nm/1550 nm bands launched from the optical fiber 50 enter into the 2×2 optical coupler 20 from the port 1. The coupler is designed such that the downstream signal is almost completely coupled to port 2 through the waveguide 21. It is then absorbed by the photodetector 30 and transformed into an electrical current. The upstream waveguide 22 connecting port 3 and port 4 of the 2×2 optical coupler is placed inside the cavity of the laser 10. The light generated in the laser cavity at 1310 nm enters into the coupler from port 3 and is partially directed to port 4 and therefore returns to the laser cavity as a feedback while the remaining part is directed to port 1 and coupled into the fiber 50 as an upstream signal.

By appropriately designing the 2×2 optical coupler and utilizing its wavelength dependence, it is possible to minimize the optical losses of both the upstream and downstream signals. The two major requirements of the 2×2 coupler are: (1) the downstream signal at 1490 nm and/or 1550 nm is almost 100% coupled from port 1 to port 2, and (2) a portion of the upstream signal at 1310 nm is coupled from port 3 to port 1 while the remaining portion is coupled from port 3 to port 4.

The waveguide layer structure in both the coupling region and the laser region contains multiple quantum wells (MQWs) with a band gap around 1310 nm. It is electrically pumped to provide optical gain for the upstream signal while it is transparent for the downstream signal at 1490 nm/1550 nm. In the detector region, an absorptive waveguide structure for the downstream wavelength bands is needed, which can be achieved by using vertical evanescent coupling through an absorption layer above the waveguide or butt coupling by using etch-and-regrowth or selective area epitaxy techniques.

In principle, either a directional coupler or a Multi-Mode Interference (MMI) coupler can be adopted as the 2×2 coupling element in the device of the present invention. However, there are several disadvantages of the traditional directional coupler, including the low fabrication tolerance. Moreover, in order to reduce the bend loss in curved waveguides, deep etched waveguides are preferred. In such situation, very narrow gap (<0.1 µm) is required to obtain sufficiently large coupling between two waveguides in the coupling region. The small dimension of the gap makes the device fabrication very difficult. A MMI coupler can mitigate the drawbacks of a directional coupler. According to the numerical simulation, however, the length of a MMI coupler which acts as the coupling component of the device needs to be very large (>1000 µm). Furthermore, the coupling coefficient of a MMI coupler is too sensitive to wavelength. It is therefore difficult to operate at two bands (1490 nm and 1550 nm) simultaneously, and thus not suitable for triplexers.

Figure 5:
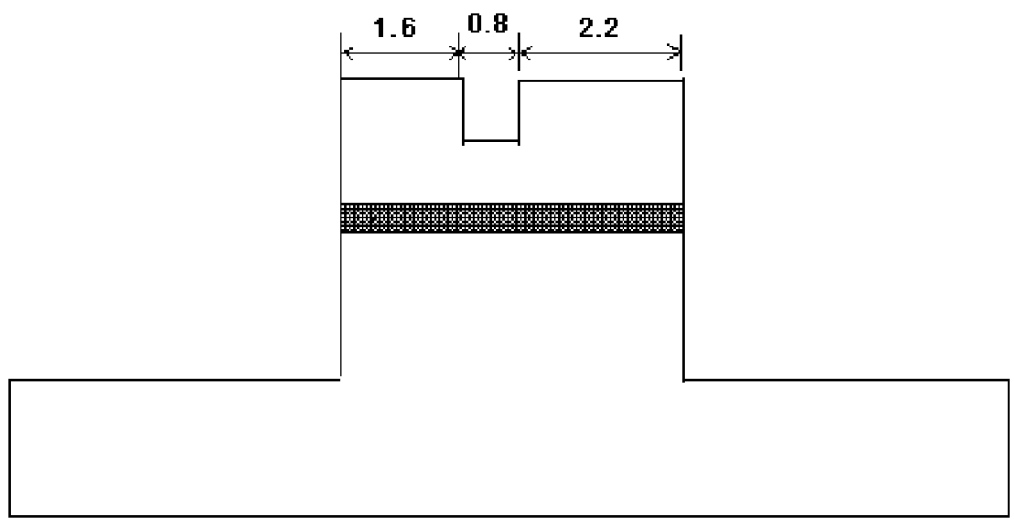
FIG. 5 is the cross section (a) and top view (b) of the bi-level etched coupling region of the 2×2 optical coupler. The lateral dimensions are indicated in micron for an example coupler.
Figure 5:
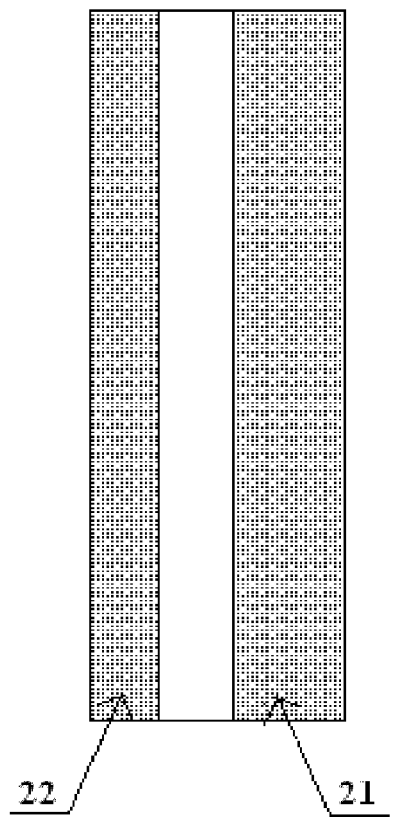

To shorten the length of the coupler, a deep etched MMI structure with a shallow etched middle trench is used for the device of the present invention. Such a bi-level etched coupler is similar to a directional coupler but does not require a very narrow gap, and the two waveguides can be asymmetric. FIG. 5 shows the cross section of the coupler. The waveguide core layer of the coupler comprises multiple quantum wells for 1310 nm. It acts as the gain layer for the 1310 nm upstream laser transmitter and passive guiding layer for 1490/1550 nm downstream signal, simultaneously. In the coupling region, a shallow etched trench is formed in the upper cladding between the waveguides. A specific example is detailed below.

The multiple quantum wells consists of ten 3.5 nm thick $In_{0.911}Ga_{0.089}As_{0.5}P_{0.5}$ quantum wells (1% compressively strained) and nine 10 nm thick unstrained InGaAsP ($\lambda_g=1.1$ µm) barriers. The thickness and effective refractive index of the MQW layer are 135 nm and 3.39, respectively. The thickness of the upper cladding is 1 µm. After an optimization process, a set of parameters is obtained for the coupler. The widths of the upstream and downstream waveguides are 1.6 µm and 2.2 µm, respectively. The length of the coupling region is 110 µm. The width and the depth of the shallow etched trench are 0.8 µm and 0.7 µm, respectively.

Figure 6:
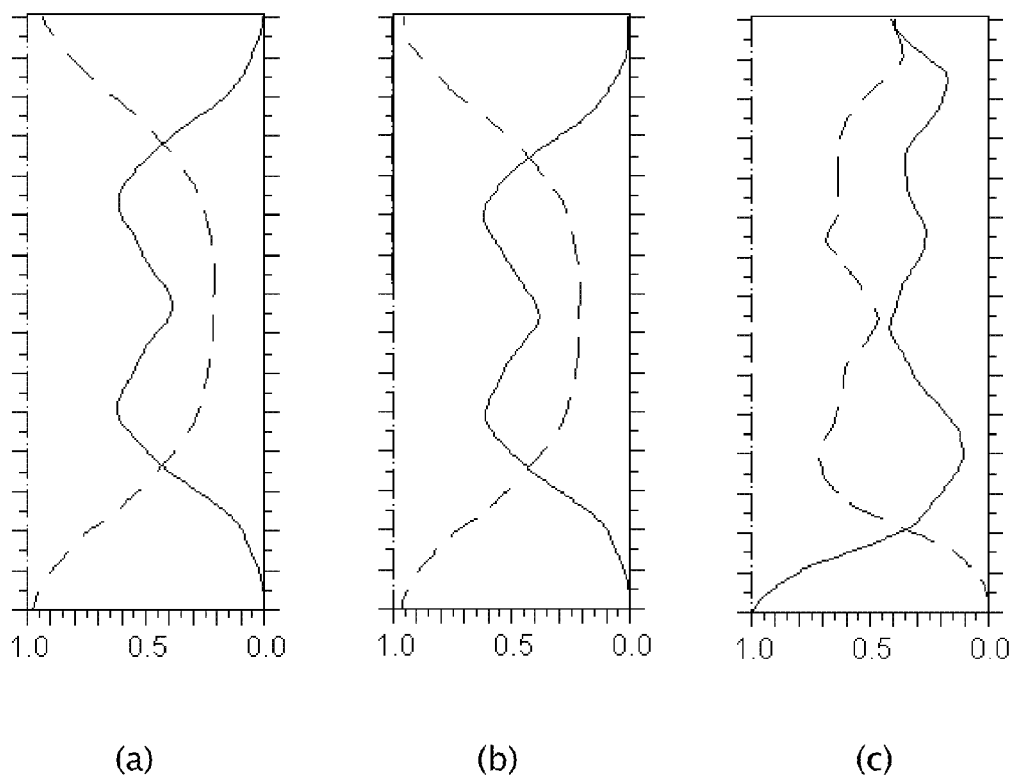
FIG. 6 is the BPM simulation of light propagation in the coupling region of the 2×2 optical coupler for wavelength at 1490 nm (a), 1550 nm (b) and 1310 nm (c). The horizontal axis represents the relative power and the vertical axis is the propagation distance. The light is launched from the downstream waveguide 21 for the cases (a) and (b) and from the upstream waveguide 22 for the case (c). The dashed line is the power in the downstream waveguide 21, and the solid line is for the power in the upstream waveguide 22.

FIG. 6 shows the simulation results of the bi-level etched coupler by using the Beam Propagation Method (BPM) for three operating wavelengths of 1490 nm, 1550 nm, and 1310 nm. We define the bar-coupling as the coupling from port 1 to port 2 and from port 3 to port 4, and the cross-coupling as the coupling from port 1 to port 3 and from port 2 to port 4. For 1490 nm and 1550 nm, the bar-coupling coefficient from the downstream waveguide is 95.5% and 94.5%, while the cross-coupling is almost 0. The excess loss is only about 0.2 dB. For the 1310 nm, both the bar-coupling and cross-coupling coefficients for light launched from the upstream waveguide is about 42%, with an excess loss of about 0.8 dB. Hence, the bi-level etched coupler can satisfy very well the coupler requirements for the device of the present invention, i.e. nearly all of the downstream optical signals (1490 nm/1550 nm) go straight through while the 1310 nm upstream signal from the laser cavity is split into two parts with minimal losses. On the other hand, the length of the coupling region is only about 15% of that for a traditional MMI coupler and our calculation shows that the fabrication tolerance of the bi-level etched coupler is also much larger. Besides, the small difference in coupling coefficient between the two downstream wavelengths makes it possible to extend the diplexer design to a triplexer by adding a wavelength demultiplexing element at the output port of the downstream signal.

Figure 7:
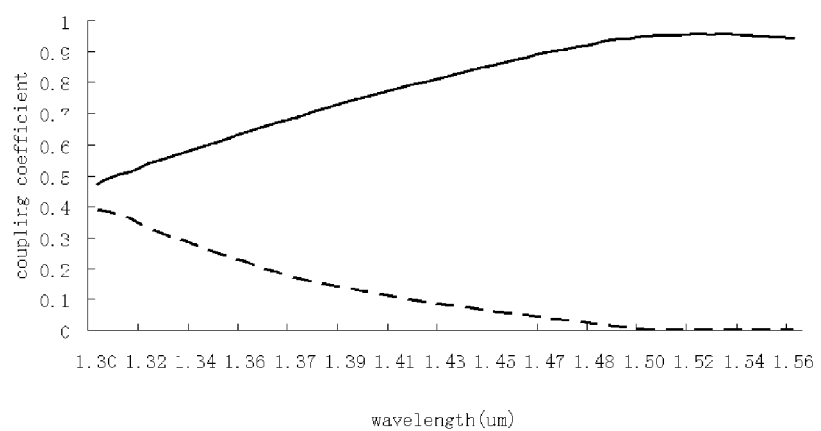
FIG. 7 is the bar-coupling coefficient (solid line) and cross-coupling (dashed line) coefficient as a function of the wavelength for the example bi-level etched coupler.

FIG. 7 shows the wavelength dependence of the bar-coupling (solid line) and cross-coupling (dashed line) coefficients for the bi-level etched coupler. The variation of the bar-coupling coefficient over the whole downstream operation window (1480 nm-1555 nm) is less than 0.1 dB.

The embodiment of FIG. 4 uses a ring resonant cavity. Usually there are clockwise (CW) mode and counterclockwise (CCW) mode in the ring laser cavity, and only one of the modes (CW mode in the example of FIG. 4) can be coupled to the output waveguide and then to the fiber as the upstream signal. The other mode will be partially coupled to port 2 and may disturb the reception of the downstream signal at the photodetector. Therefore, some optical interference structure may be added inside or outside the laser cavity to suppress the undesired mode.

Figure 8:
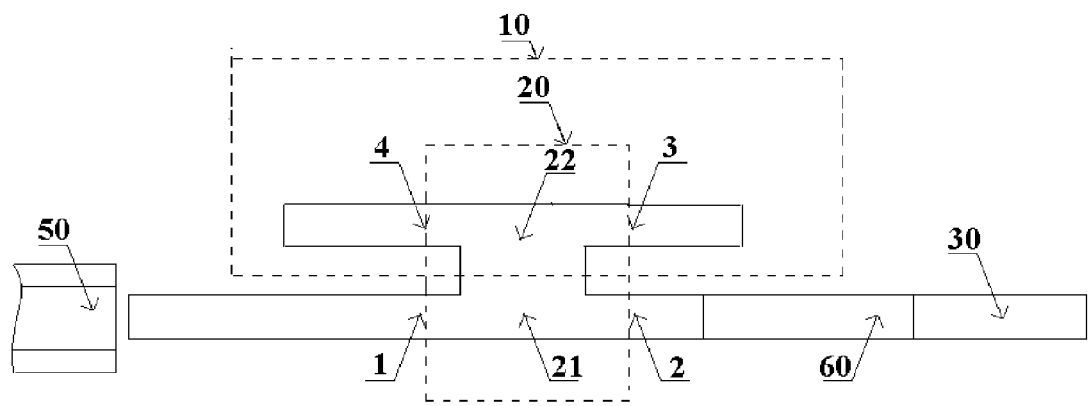
FIG. 8 is a schematic diagram of the second embodiment of the present invention, in which a Fabry-Perot cavity is used for the laser and a reverse-biased waveguide 60 which is absorptive for the laser emission is placed between port 2 and the photodetector 21 for reducing the crosstalk.

FIG. 8 shows another embodiment of the present invention in which the port 3 and port 4 of the coupler is terminated with a partially reflecting element such as a cleaved facet. A Fabry-Perot (FP) cavity is thus formed for the laser transmitter at 1310 nm. In this case, the light emitted from the laser cavity is coupled to both port 1 (forward beam) and port 2 (backward beam) of the coupler. To prevent the backward beam at port 2 from entering into the photodetector and disturbing the downstream signal (1490/1550 nm) detection, an additional waveguide 60 of several hundreds micrometers is added to absorb it. A reverse biased voltage may be applied to the waveguide 60 so that it can also be used as a power monitor of the laser.

The ring or Fabry-Perot laser in the above embodiments usually operates at multiple longitudinal modes. To achieve single mode operation, one can use a composite laser cavity that consists of two or more coupled cavities of different optical lengths. Another approach is to use a ring or Fabry-Perot cavity with several partially reflective slots. Alternatively, the Fabry-Perot laser in FIG. 8 can also be replaced by a distributed feedback (DFB) laser with a laterally coupled grating.

Numerous other embodiments can be envisaged without departing from the spirit and scope of the invention.

What is claimed is:

1. A monolithically integrated single-fiber multi-directional transceiver comprising a laser 10 for transmitting a first optical signal at a first wavelength, a photodetector 30 for receiving a second optical signal at a second wavelength, and a 2×2 4-port optical coupler 20, said optical coupler 20 being structured such that it receives the second optical signal from an optical fiber 50 at port 1 and directs it to port 2 which leads to the photodetector 30 where the second optical signal is absorbed, whereas an optical waveguide connecting port 3 and port 4 within the coupler 20 is placed inside the cavity of the laser 10 so that a portion of the light generated inside the cavity and launched from port 3 is coupled to port 4 and therefore remains in the cavity as an optical feedback while the other portion of the light is coupled to port 1 and is transmitted to the same optical fiber 50.

2. A monolithically integrated single-fiber multi-directional transceiver as defined in claim 1, wherein the 2×2 optical coupler contains bi-level etched waveguides with deep etched outer sidewalls of the coupling region and a shallow etched trench separating the two waveguides in the coupling region, the length of the coupling region and the width of the shallow etched trench being designed such that the second optical signal at the second wavelength is completely coupled from port 1 to port 2 while the first optical signal at the first wavelength at port 3 is partially coupled to port 4 and partially coupled to port 1.

3. A monolithically integrated single-fiber multi-directional transceiver as defined in claim 1, wherein the port 3 and port 4 of said 2×2 optical coupler 20 is connected by a curved waveguide outside the optical coupler, thus forming a ring resonator for the laser 10.

4. A monolithically integrated single-fiber multi-directional transceiver as defined in claim 1, wherein both of the port 3 and port 4 of said 2×2 optical coupler are terminated with partial reflecting facets which form a Fabry-Perot cavity.

5. A monolithically integrated single-fiber multi-directional transceiver as defined in claim 1, wherein the laser cavity contains several partially reflecting etched trenches for the purpose of mode selection.

6. A monolithically integrated single-fiber multi-directional transceiver as defined in claim 1, wherein the laser cavity comprises a distributed feedback grating.

7. A monolithically integrated single-fiber multi-directional transceiver as defined in claim 1, wherein the cavity of the laser 10 consists of several mutually coupled Fabry-Perot or ring cavities having different optical lengths.

8. A monolithically integrated single-fiber multi-directional transceiver as defined in claim 1, wherein the laser 10 and the 2×2 optical coupler contain a quantum well structure acting as a gain medium for the first optical signal at the first wavelength and is transparent for the second optical signal at the second wavelength which is longer than the first wavelength, wherein the photodetector region at port 2 contains an absorption layer for absorbing the second optical signal.

9. A monolithically integrated single-fiber multi-directional transceiver as defined in claim 1, wherein a reverse-biased waveguide 60 is placed between port 2 and the photodetector region, said waveguide 60 being capable of absorbing the backward emitted light at the first wavelength from the laser 10 while being transparent for the second optical signal at the second wavelength, said waveguide 60 being used for eliminating the crosstalk caused by the backward emitted light from the laser while serving as a power monitor of the laser.

10. A monolithically integrated single-fiber multi-directional transceiver as defined in claim 1, wherein the laser 10 transmits the first optical signal at a wavelength around 1310 nm and the second optical signal directed from port 1 to port 2 includes two wavelengths around 1490 nm and 1550 nm, respectively, and a wavelength division multiplexing element is placed at port 2 to separate said two wavelengths at 1490 nm and 1550 nm and direct them to two different photodetectors.

* * * * *